US007781889B2

(12) United States Patent
Leader et al.

(10) Patent No.: US 7,781,889 B2
(45) Date of Patent: Aug. 24, 2010

(54) SHIELDED VIA (75) Inventors: Bram Leader, Gig Harbor, WA (US); Richard R. Doersch, White Salmon, WA (US)

(73) Assignee: Intel Corporation, Santa Clara, CA (US)

( * ) Notice: Subject to any disclaimer, the term of this patent is extended or adjusted under 35 U.S.C. 154(b) by 581 days.

(21) Appl. No.: 11/477,703

(22) Filed: Jun. 29, 2006

(65) Prior Publication Data
US 2008/0001286 A1  Jan. 3, 2008

(51) Int. Cl.
*H01L 23/48* (2006.01)
*H01L 23/535* (2006.01)
*H05K 3/42* (2006.01)

(52) U.S. Cl. .............. 257/734; 257/E23.168; 257/E21.496; 257/774; 257/763; 257/767; 174/266; 174/261; 174/255; 174/262; 361/794; 361/795

(58) Field of Classification Search ........ 257/774, 257/734, 700, 701, 758, 698, E23.168, E21.496, 257/763, 767; 174/261, 255, 262, 266; 361/794, 361/795, 792; 438/637
See application file for complete search history.

(56) References Cited

U.S. PATENT DOCUMENTS

| | | | | |
|---|---|---|---|---|
| 4,924,236 A | * | 5/1990 | Schuss et al. | 343/700 MS |
| 5,039,965 A | * | 8/1991 | Higgins, Jr. | 333/182 |
| 5,050,295 A | * | 9/1991 | Sullivan et al. | 29/830 |
| 5,421,083 A | * | 6/1995 | Suppelsa et al. | 29/852 |
| 5,774,340 A | * | 6/1998 | Chang et al. | 361/771 |
| 5,949,030 A | | 9/1999 | Fasano et al. | |
| 6,388,206 B2 | | 5/2002 | Dove et al. | |
| 6,605,551 B2 | * | 8/2003 | Wermer et al. | 438/778 |
| 6,617,526 B2 | * | 9/2003 | Miller | 174/261 |
| 6,717,071 B2 | | 4/2004 | Chang et al. | |
| 7,230,318 B2 | * | 6/2007 | Kripesh et al. | 257/621 |
| 7,361,994 B2 | * | 4/2008 | Ye | 257/758 |
| 2006/0091495 A1 | * | 5/2006 | Palanduz et al. | 257/532 |
| 2006/0237227 A1 | * | 10/2006 | Zhao et al. | 174/262 |
| 2007/0184654 A1 | * | 8/2007 | Akram et al. | 438/675 |
| 2007/0199736 A1 | * | 8/2007 | Wang | 174/266 |
| 2009/0200682 A1 | * | 8/2009 | Zhang | 257/774 |

OTHER PUBLICATIONS

"PCT International Search Report of the International Searching Authority", mailed Jan. 3, 2008, for PCT/US2007/072321, 3pgs.

* cited by examiner

*Primary Examiner*—Alexander O Williams
(74) *Attorney, Agent, or Firm*—Buckley, Maschoff & Talwalkar LLC (57) ABSTRACT

A system may include a first conductive ground pad, a second conductive ground pad, a first conductive via coupling the first ground pad to the second ground pad, a first conductive signal trace, a second conductive signal trace, and a second conductive via disposed within the first conductive via and coupling the first conductive signal trace to the second conductive signal trace. The first conductive ground pad and the second conductive ground pad may be disposed between the first conductive signal trace and the second conductive signal trace.

8 Claims, 8 Drawing Sheets

SHIELDED VIA

BACKGROUND

Layer-to-layer vias within conventional circuit boards may be susceptible to crosstalk and noise pick-up (i.e., jitter) due to closely-adjacent signal vias or traces. These issues become more pronounced as pitch densities increase and as these vias become thereby further encroached. High-density circuit boards are particularly troublesome due to their small features sizes and due to their increased thickness, which also increases the electrical coupling length of adjacent vias.

Conventional techniques to address the foregoing include placing a number of ground vias around a signal via, which takes up significant circuit board space and impedes inner layer routing. Other techniques include micro-coax solutions and wires embedded within circuit boards. Notwithstanding their effectiveness in addressing the above issues, the trade-offs presented by these techniques may be unacceptable in any number of usage scenarios.

DETAILED DESCRIPTION

Figure 1:
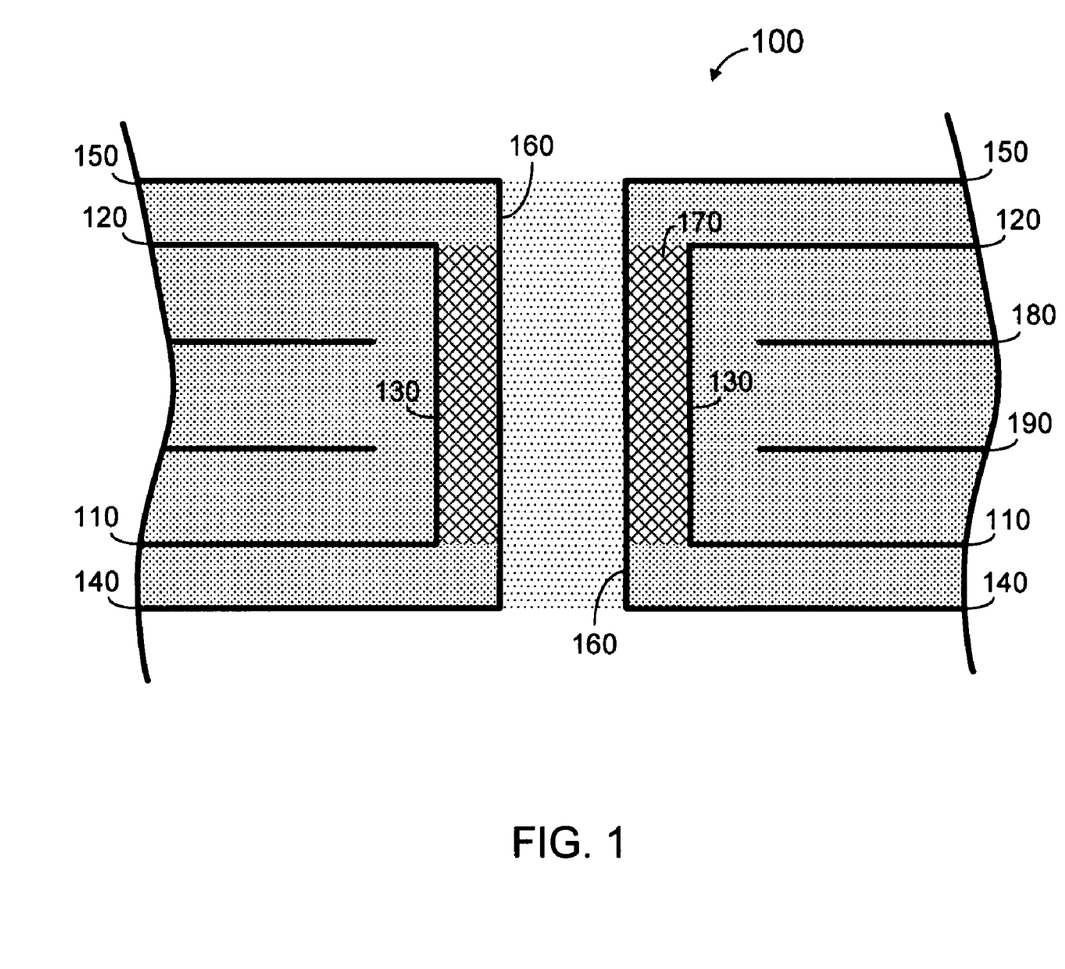
FIG. 1 is a side cross-sectional view of an apparatus according to some embodiments.

FIG. 1 is a cross-sectional side view of apparatus 100 according to some embodiments. In some embodiments, apparatus 100 may comprise a portion of a circuit board. Apparatus 100 may therefore comprise, but is not limited to, a computer motherboard, an expansion card circuit board, a mobile computing platform, and a server platform.

More specifically, apparatus 100 includes conductive ground pad 110 and conductive ground pad 120. The conductive elements mentioned herein may comprise any suitable conductor or conductors, including but not limited to copper. Conductive ground pad 110 and conductive ground pad 120 may comprise reference planes for supplying reference voltages (i.e., ground) to electrical components that are connected to apparatus 100. In some embodiments, conductive ground pad 110 and/or conductive ground pad 120 is disposed within a routing layer including conductive traces for carrying electrical signals between such electrical components.

Conductive via 130 electrically couples conductive ground pad 110 and conductive ground pad 120. Conductive via 130 may be fabricated by electroless copper plating followed by electro-plating or by any other system that is or becomes known. Conductive via 130 may be considered a "ground" via because it is electrically coupled to ground pad 110 and to ground pad 120.

Apparatus 100 also comprises conductive signal trace 140 and conductive signal trace 150. Conductive signal trace 140 and conductive signal trace 150 may comprise pads which are disposed in respective routing layers of apparatus 100 and which are elements of respective conductive traces. Conductive via 160 electrically couples conductive signal trace 140 and conductive signal trace 150. Fabrication of conductive via 160 according to some embodiments will be described in detail below.

Dielectric 170 is disposed between via 130 and via 160. According to some embodiments, dielectric 170 assists in electrical isolation of via 160. In some embodiments, dielectric 170 is composed of a material that facilitates insertion thereof within via 130 and/or facilitates creation of an opening therein. Dielectric 170 may comprise an epoxy such as, but not limited to, a thermally-cured hole-plugging resist.

Apparatus 100 of FIG. 1 also includes conductive signal traces 180 and 190. Traces 180 and 190 may be disposed in respective routing layers. According to some embodiments, one or both of conductive traces 180 and 190 are to carry power or I/O signals.

The shaded, non-crosshatched portions of apparatus 100 represent dielectric material. This dielectric material serves to separate conductive elements of apparatus 100 and to provide desirable electrical characteristics thereto. According to some embodiments, dielectric material disposed within via 160 might exhibit a lower or higher dielectric constant than the other illustrated dielectric material. Such an arrangement may provide improved control of an impedance encountered by a signal traveling through via 160.

Some embodiments of the foregoing provide shielding of a signal via using a ground layer along a length of the via. Such embodiments may reduce crosstalk and other signal degrading phenomena in some applications.

Figure 2:
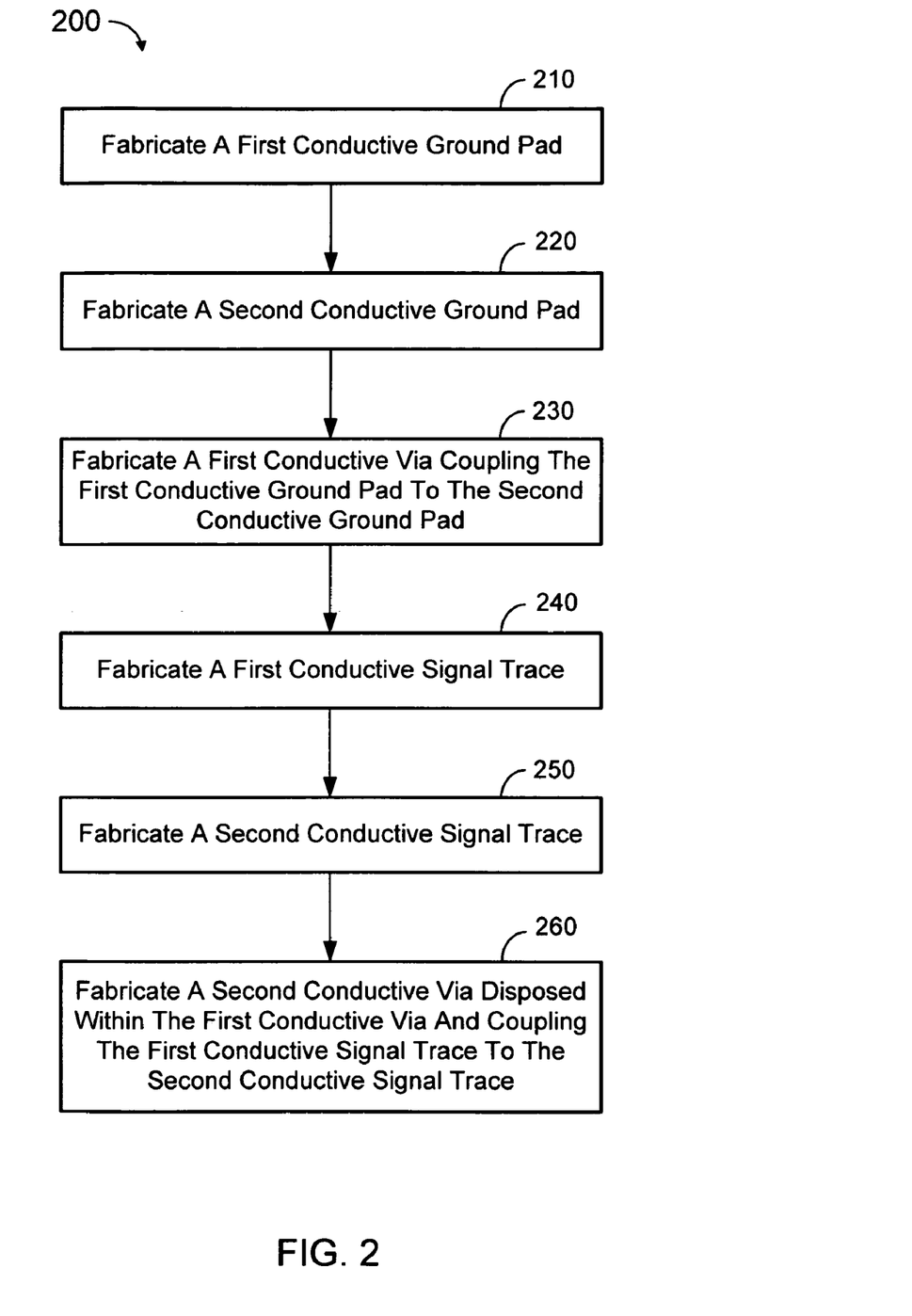
FIG. 2 is a diagram of a process to fabricate an apparatus according to some embodiments.

Process 200 of FIG. 2 may be used to fabricate an apparatus according to some embodiments. Process 200 may be performed by any system or systems, and one or more aspects may be performed manually. Examples of process 200 will be provided below with respect to apparatus 100, but embodiments are not limited thereto.

A first conductive ground pad is fabricated at 210, and a second conductive ground pad is fabricated at 220. The first and second conductive ground pads may be elements of a respective ground plane, split plane (i.e., a plane accommodating signal traces and a ground/power area), or routing layer. Next, at 230, a first conductive via is fabricated. The first conductive via couples the first conductive ground pad to the second conductive ground pad.

Figure 3:
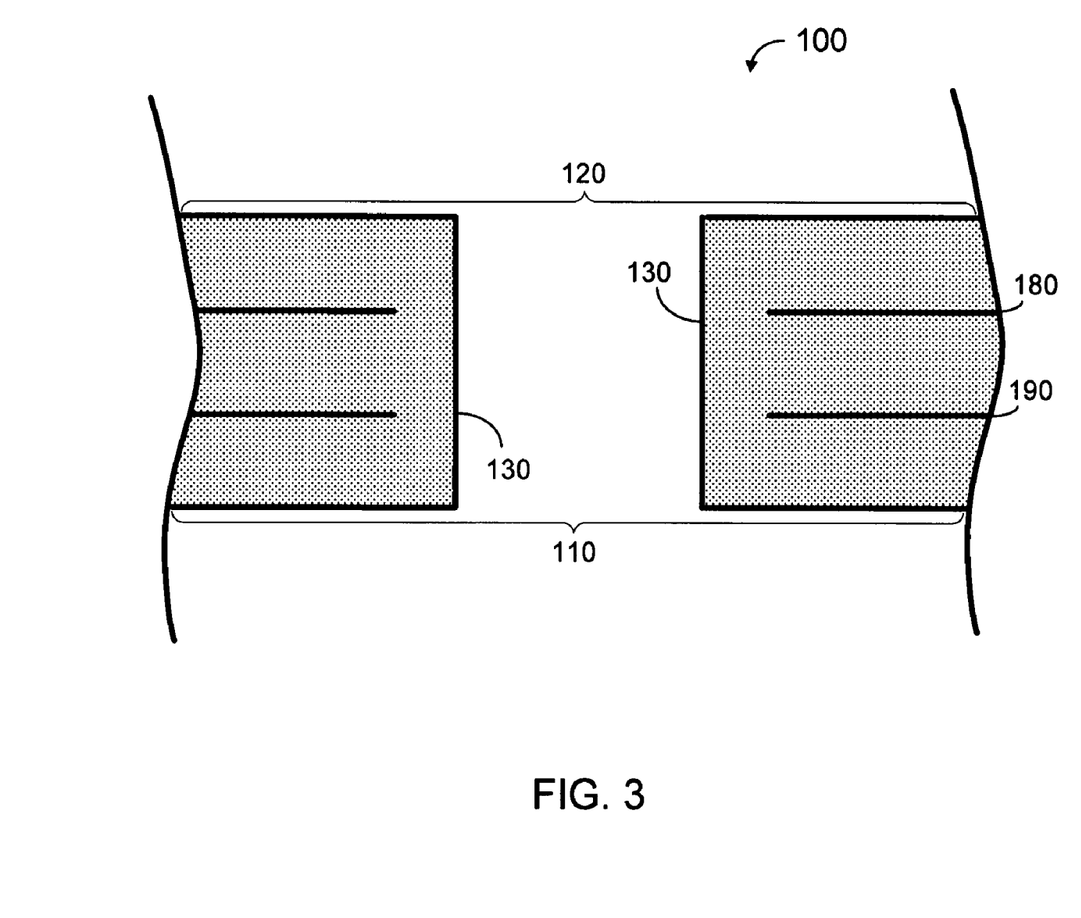
FIG. 3 is a side cross-sectional view of an apparatus according to some embodiments.

Fabrication at 210 through 230 may proceed using any suitable materials and techniques that are or become known. According to some embodiments, the first conductive ground pad and the second conductive ground pad comprise circuit board cores which are fabricated separately and laminated together prior to 230. FIG. 3 is a cross-sectional view of apparatus 100 after 230. As shown, ground pad 110 and ground pad 120 have been fabricated, and via 130 couples ground pad 110 to ground pad 120.

In some embodiments of 230, via 130 is fabricated by removing material (e.g., using drilling or etching techniques) and by plating the opening created thereby with conductive material. Plating may comprise a first process by which electroless copper is deposited on the walls of the opening, and a second process by which copper is plated upon the electroless copper so as to electrically couple the first conductive ground pad and the second conductive ground pad. According to some embodiments, a diameter of via 130 is larger than a conventional via diameter.

FIG. 3 also illustrates the fabrication of traces 180 and 190. Accordingly, in some embodiments, ground pad 110 is fabricated, a dielectric is deposited thereon, signal trace 190 is fabricated, a dielectric is deposited thereon, signal trace 180 is fabricated, a dielectric is deposited thereon, and ground pad 120 is fabricated. Next, an opening is drilled from ground pad 120 through ground pad 110, and an interior surface of the opening is plated with a conductive material to electrically couple ground pad 120 to ground pad 110.

Figure 4:
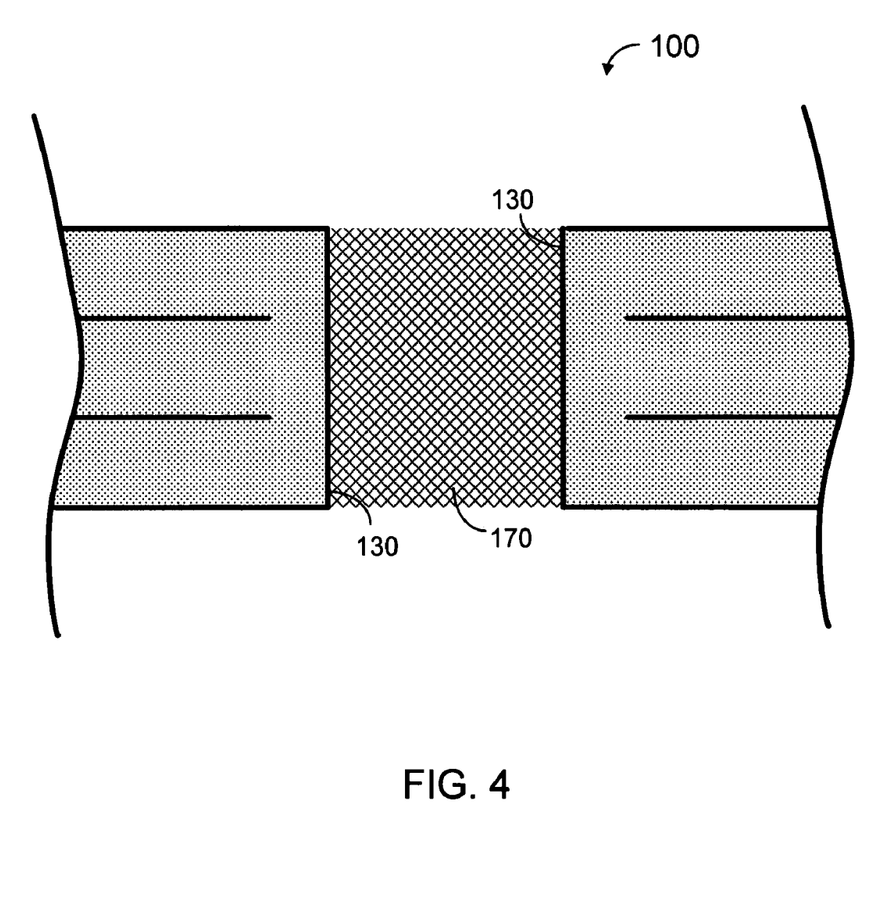
FIG. 4 is a side cross-sectional view of an apparatus according to some embodiments.

FIG. 4 illustrates a next stage of process 200 according to some embodiments. Specifically, FIG. 4 shows dielectric 170 disposed within via 130. Accordingly, process 200 may include inserting dielectric 170 within via 130 after fabrication of via 130. As described above, dielectric 170 may comprise a liquid epoxy that exhibits a desired dielectric constant. The dielectric constant may be selected so as to result in the correct impedance value for a signal via to be described below. Flow may proceed from 230 to 240 after curing and planarizing dielectric 170.

Figure 5:
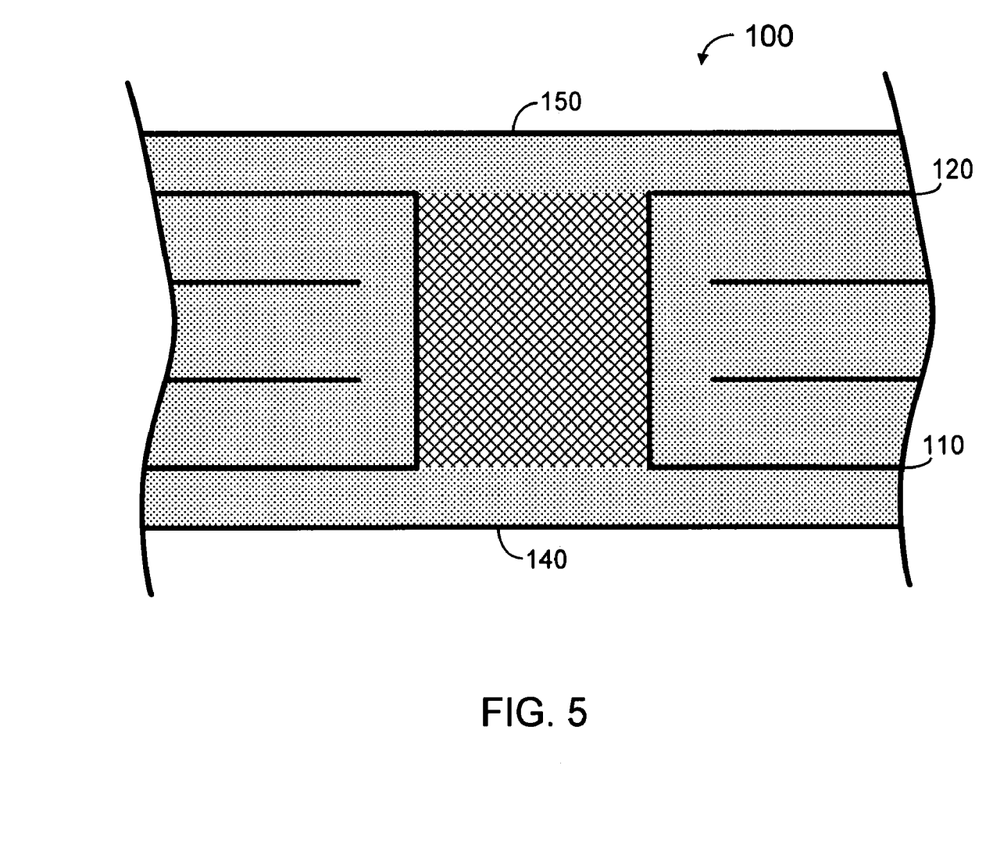
FIG. 5 is a side cross-sectional view of an apparatus according to some embodiments.

A first conductive signal trace is fabricated at 240, and a second conductive signal trace is fabricated at 250. As illustrated in the example of FIG. 5, conductive signal trace 140 may be fabricated on a first side of apparatus 100 at 240, and conductive signal trace 150 may be fabricated on a second side at 250. Such fabrication may comprise depositing dielectric material on ground pad 110 and ground pad 120, and then fabricating signal traces 140 and 150 thereon. Alternatively, signal traces 140 and 150 may be elements of respective circuit board portions that are laminated to the FIG. 4 structure at 240 and 250, respectively. As a result, ground pad 110 and ground pad 120 are disposed between signal trace 140 and signal trace 150.

Figure 6:
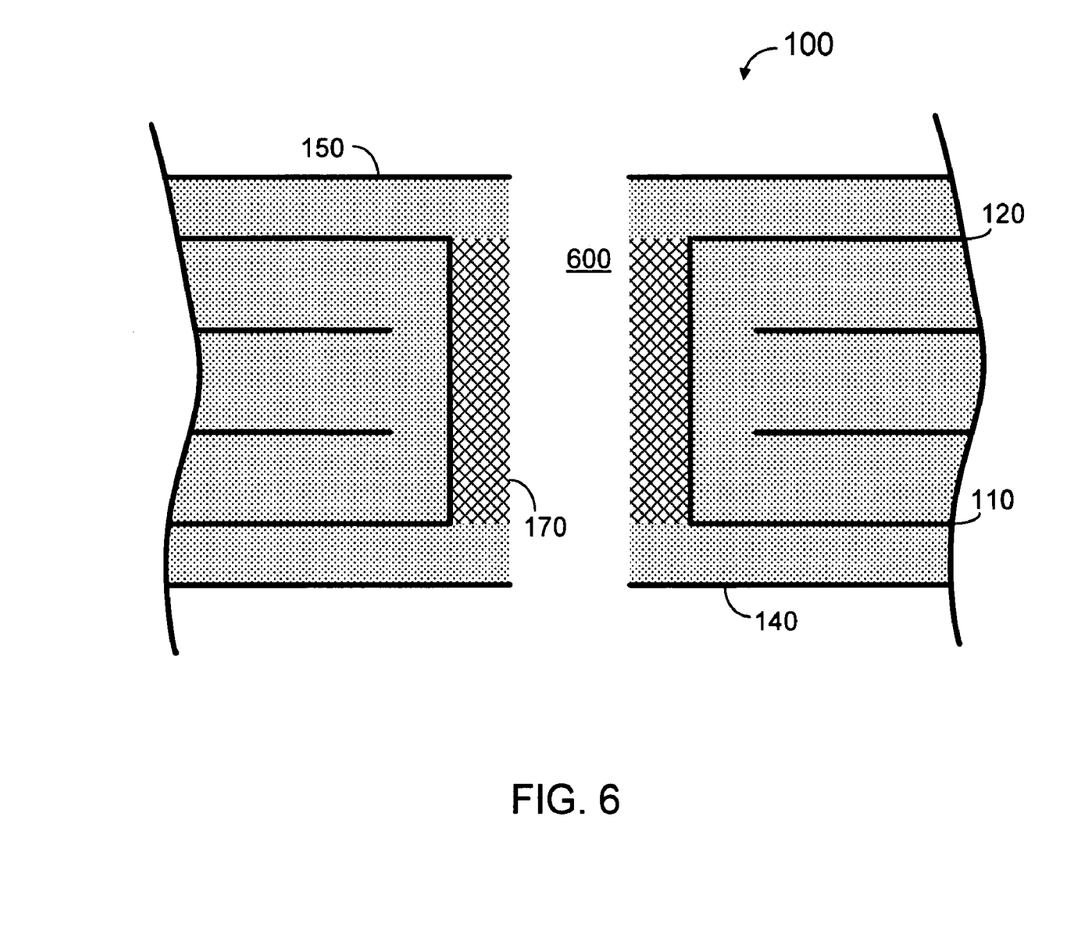
FIG. 6 is a side cross-sectional view of an apparatus according to some embodiments.

A second conductive via is fabricated at 260. The second conductive via is disposed within the first conductive via, and couples the first conductive signal trace to the second conductive signal trace. FIG. 6 illustrates fabrication of the second conductive via at 260 according to some embodiments. As illustrated, opening 600 may be smaller than an outer dimension of via 130, and is created through first conductive signal trace 140, second conductive signal trace 150, and dielectric 170. According to some embodiments, opening 600 is creating by drilling through apparatus 100 using optical or x-ray alignment processes. A standard via plating process may then be used to plate the walls of opening 600 and to result in the structure illustrated in FIG. 1. Some embodiments therefore employ conventional fabrication techniques in a non-obvious manner to generate a shielded signal via.

Figure 7A:
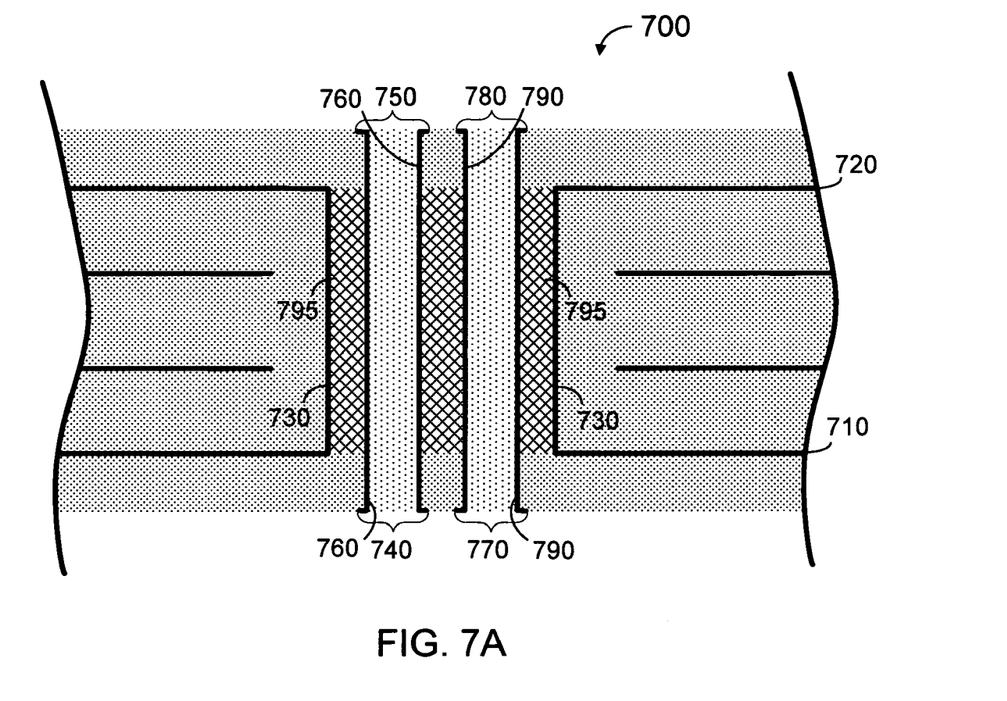
FIG. 7A is a side cross-sectional view of an apparatus according to some embodiments.

FIG. 7 illustrates apparatus 700 according to some embodiments. Apparatus 700 may comprise a portion of a circuit board of any suitable computing system.

Apparatus 700 includes conductive ground pad 710, conductive ground pad 720 and conductive via 730. Conductive via 730 electrically couples conductive ground pad 710 and conductive ground pad 720. Apparatus 700 also comprises conductive signal trace 740 and conductive signal trace 750. Conductive via 760 couples conductive signal trace 740 to conductive signal trace 750. Similarly, conductive signal trace 770 and conductive signal trace 780 are coupled by conductive via 790.

According to some embodiments, conductive signal trace 740, conductive signal trace 750, and conductive via 760 are to carry a first component of a differential signal. Likewise, conductive signal trace 770, conductive signal trace 780, and conductive via 790 are to carry a second component of the differential signal.

Dielectric 795 is disposed within via 730 and around vias 760 and 790. According to some embodiments, dielectric 795 may comprise an epoxy and/or may assist in electrical isolation of vias 760 and 790 and of the differential signals that may or may not be carried thereby. In some embodiments, a differential impedance may be controlled by controlling the dielectric constant of dielectric 795 and the distance between the vias 760 and 790. Embodiments may therefore provide shielded differential pair vias with a desirable impedance.

Figure 7B:
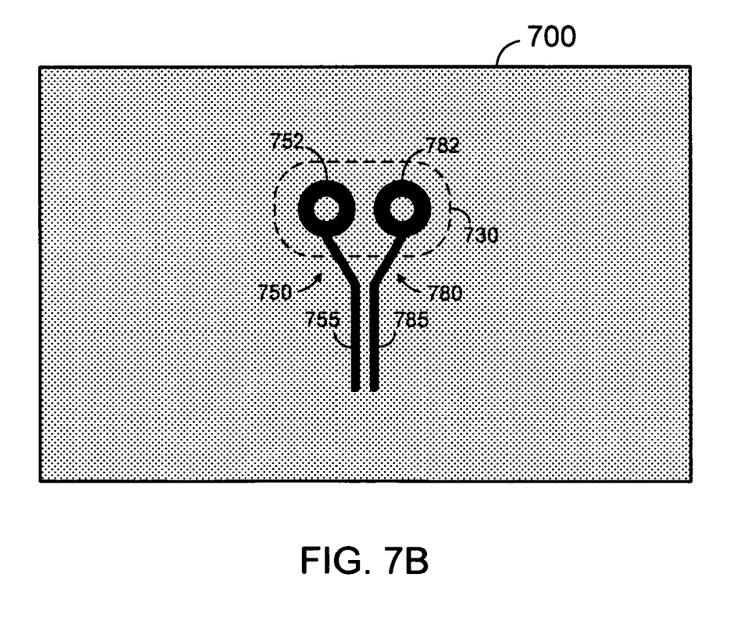
FIG. 7B is a plan view of the FIG. 7A apparatus according to some embodiments

FIG. 7B is a plan view of apparatus 700 of FIG. 7A. As shown, conductive signal trace 750 includes pad 752 and trace 755, while conductive signal trace 780 includes pad 782 and trace 785. To provide further clarity as to the structure of apparatus 700, the dotted line of FIG. 7B illustrates an outer dimension of via 730 in relation to traces 750 and 780.

Figure 8:
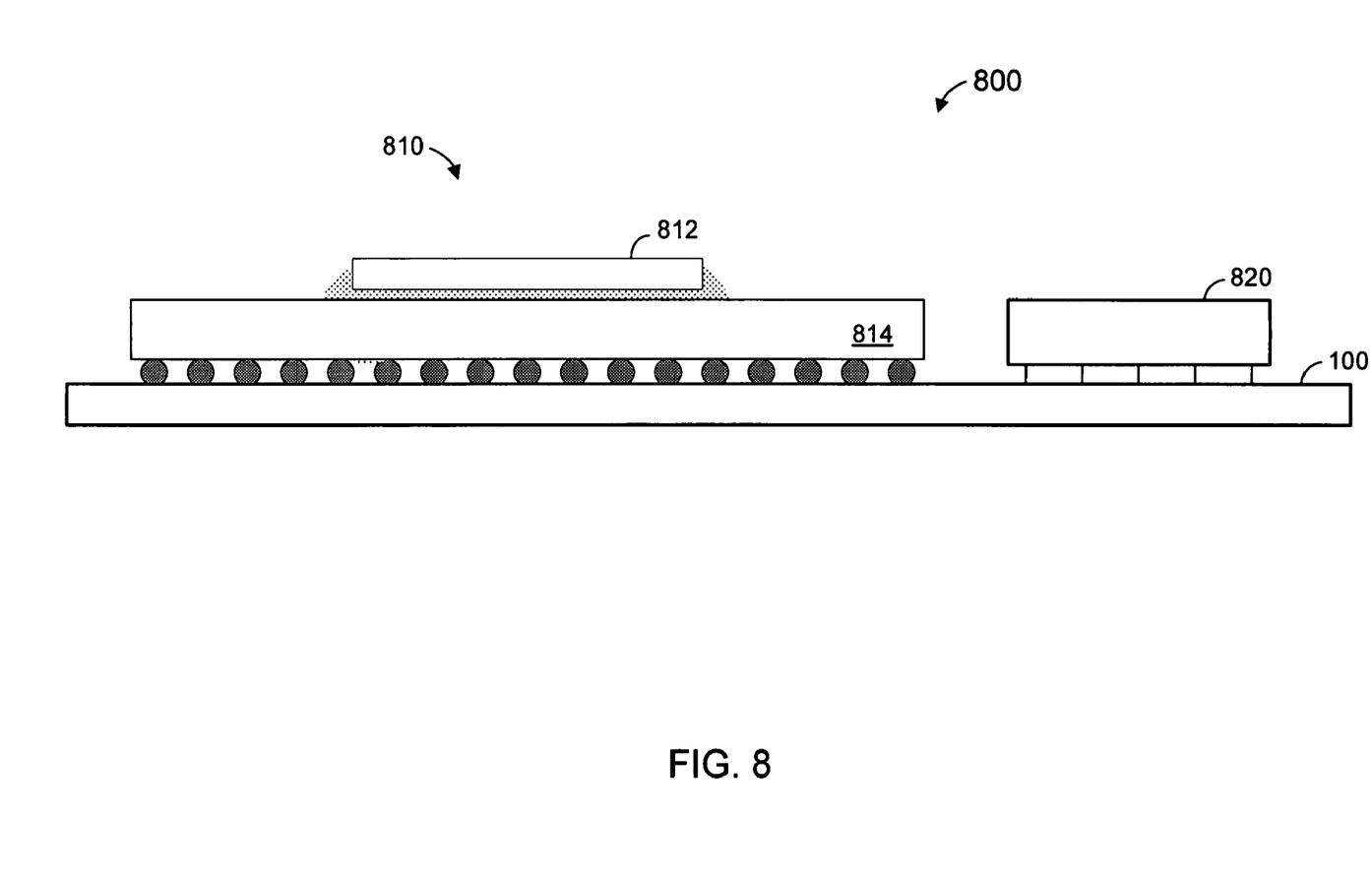
FIG. 8 is a diagram of a system according to some embodiments.

FIG. 8 is a cross-sectional side view of system 800 according to some embodiments. System 800 may comprise components of a computing platform. System 800 includes integrated circuit package 810, memory 820, and motherboard 100 as described above.

Integrated circuit die 812 of package 810 may include integrated electrical devices for providing microprocessor functionality and may be fabricated using any suitable materials and fabrication techniques. The electrical devices may reside between a substrate of integrated circuit die 812 and integrated circuit package substrate 814 in a "flip-chip" arrangement. In some embodiments, integrated circuit die 812 comprises an Intel Pentium® microprocessor having a silicon substrate.

Integrated circuit package substrate 814 may comprise any ceramic, organic, and/or other suitable material, including but not limited to an organic laminated glass-weave polymer. Integrated circuit package substrate 814 provides physical support to die 812 and also provides routing of power and signals between die 812 and motherboard 100. According to some embodiments, integrated circuit package substrate 814 comprises conductive pads, signal traces and vias such as those described and illustrated herein.

Motherboard 100 may electrically couple memory 820 to die 812. More particularly, motherboard 100 may comprise a bus (not shown) that is electrically coupled to die 812 and to memory 820. Memory 820 may comprise any type of memory for storing data, such as a Single Data Rate Random Access Memory, a Double Data Rate Random Access Memory, a Fully-Buffered Dual In-line Memory Module, or a Programmable Read Only Memory.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, other embodiments may be practiced with various modifications and alterations.

What is claimed is:

1. An apparatus comprising:
   a first conductive ground pad;
   a second conductive ground;
   a first conductive via electrically coupling the first ground pad to the second ground pad;
   a first conductive signal trace pad separated from the first conducive ground pad by a first material;
   a second conductive signal trace;

a second conductive via disposed within the first conductive via and coupling the first conductive signal trace to the second conductive signal trace; and a second material that is different than the first material and comprises an epoxy, wherein the second material is disposed between the first conductive via and the second conductive via, wherein the first conductive ground pad and the second conductive ground pad are disposed between the first conductive signal trace and the second conductive signal trace.

2. The apparatus according to claim 1, further comprising:
one or more conductive signal traces disposed between the first ground pad and the second ground pad.

3. The apparatus according to claim 1, wherein the apparatus comprises an integrated circuit package substrate.

4. A method comprising:
fabricating a first conductive ground pad;
fabricating a second conductive ground pad;
fabricating a first conductive via electrically coupling the first ground pad to the second ground pad;
fabricating a first conductive signal trace separated from the first conducive ground pad by a first material;
fabricating a second conductive signal trace;
fabricating a second conductive via disposed within the first conductive via and coupling the first conductive signal trace to the second conductive signal trace; and
fabricating a second material that is different than the first material and comprises an epoxy, wherein the second material is disposed between the first conductive via and the second conductive via,
wherein the first conductive ground pad and the second conductive ground pad are disposed between the first conductive signal trace and the second conductive signal trace.

5. The method according to claim 4, wherein fabricating the second conductive via comprises:
inserting a dielectric comprising the second material within the first conductive via;
creating an opening through the dielectric, the first conductive signal trace and the second conductive signal trace; and
coating the opening with a conductor to electrically couple the first conductive signal trace to the second conductive signal trace.

6. The method according to claim 4, further comprising:
fabricating one or more conductive signal traces between the first ground pad and the second ground pad.

7. A system comprising:
a microprocessor;
a double data rate memory in communication with the microprocessor die,
a motherboard coupled to the microprocessor and to the double data rate memory, the motherboard comprising:
a first conductive ground pad;
a second conductive ground pad;
a first conductive via electrically coupling the first ground pad to the second ground pad;
a first conductive signal trace separated from the first conducive ground pad by a first material;
a second conductive signal trace;
a second conductive via disposed within the first conductive via and coupling the first conductive signal trace to the second conductive signal trace; and
a second material that is different than the first material and comprises an epoxy, wherein the second material is disposed between the first conductive via and the second conductive via,
wherein the first conductive ground pad and the second conductive ground pad are disposed between the first conductive signal trace and the second conductive signal trace.

8. The system according to claim 7, further comprising:
one or more conductive signal traces disposed between the first ground pad and the second ground pad.

* * * * *